United States Patent [19]

Isaacs et al.

[11] Patent Number: 5,446,960
[45] Date of Patent: Sep. 5, 1995

[54] ALIGNMENT APPARATUS AND METHOD FOR PLACING MODULES ON A CIRCUIT BOARD

[75] Inventors: Phillip D. Isaacs, Rochester; Thomas D. Kidd, Stewartville; Bradley H. Redfield, Pine Island; Jeffrey L. Stone, Rochester, all of Minn.

[73] Assignee: International Business Machines Corporation, Armonk, N.Y.

[21] Appl. No.: 196,329

[22] Filed: Feb. 15, 1994

[51] Int. Cl.[6] .......................... H05K 3/30; B23P 19/00
[52] U.S. Cl. ........................................ 29/834; 29/759; 29/407; 29/464; 29/740; 228/180.21
[58] Field of Search .................. 29/833, 407, 834, 741, 29/759, 840, 740; 228/180.21

[56] References Cited

U.S. PATENT DOCUMENTS

| | | | |
|---|---|---|---|
| 3,868,764 | 3/1975 | Hartlerood | 228/180.21 X |
| 3,868,765 | 3/1975 | Hartlerood | 228/180.21 X |
| 3,931,922 | 1/1976 | Jackson et al. | 29/834 X |
| 4,342,090 | 7/1982 | Caccoma et al. | 29/834 X |
| 4,476,626 | 10/1984 | Gumbert et al. | 29/740 |
| 4,479,298 | 10/1984 | Hug | 29/589 |
| 4,633,584 | 1/1987 | Wright et al. | 29/834 |
| 4,670,981 | 6/1987 | Kubota et al. | 29/834 X |
| 4,722,135 | 2/1988 | Read | 29/740 |
| 4,776,080 | 10/1988 | Christensen | 29/430 |
| 4,810,154 | 3/1989 | Klemmer et al. | 414/222 |
| 5,048,178 | 9/1991 | Bindra et al. | 29/830 |
| 5,074,036 | 12/1991 | Dunaway et al. | 29/834 |
| 5,128,834 | 7/1992 | Kaschke | 361/417 |
| 5,153,983 | 10/1992 | Oyama | 29/740 |
| 5,208,976 | 5/1993 | Bess et al. | 29/837 |

OTHER PUBLICATIONS

Research Disclosure, BT890-0064, F. Weindelmayer, "SXLAT Chuck Pallet Lock", Oct. 1991, No. 330.
IBM Technical Disclosure Bulletin, vol. 36, No. 07, Jul. 1993, RO892-0855, "Solder Ball Connect Placement Nest", D. P. Best, et al.
Panasonic, Panasert Series, General Catalog for Internepcon, "MPA-80/40(N), Multi-Functional Placement Machine Capable of Handling . . . ," p. 17.
Surface Mount Technlogy, Nov. 1993, "CBGA: A Packaging Advantage", J. Bartley, et al, pp. 35, 36 and 40.

Primary Examiner—Carl J. Arbes
Attorney, Agent, or Firm—Owen J. Gamon

[57] ABSTRACT

An alignment apparatus and method that provides a pick and placement tool that picks matrix leaded modules from trays, places the modules into a self-aligning nest, picks the modules from the nest and places them on a printed circuit board. The specific location and orientation of the nest with respect to a printed circuit board is known by the pick and placement tool. Once the nest has aligned the module, the tool picks the module from the nest and places it in the appropriate location on the printed circuit board. The nest has sloped sides that angle toward that bottom and are slippery. These sides funnel the module toward the bottom of the nest and correct gross misalignment. At the bottom inside of the nest are locating features into which the leads of the module fit. Between the locating features are slip surfaces so that the module leads slide into the locating features, correcting fine misalignment. Embodiments of the nest work for matrix leaded modules, including ball grid array, column grid array, and land grid array modules.

10 Claims, 6 Drawing Sheets

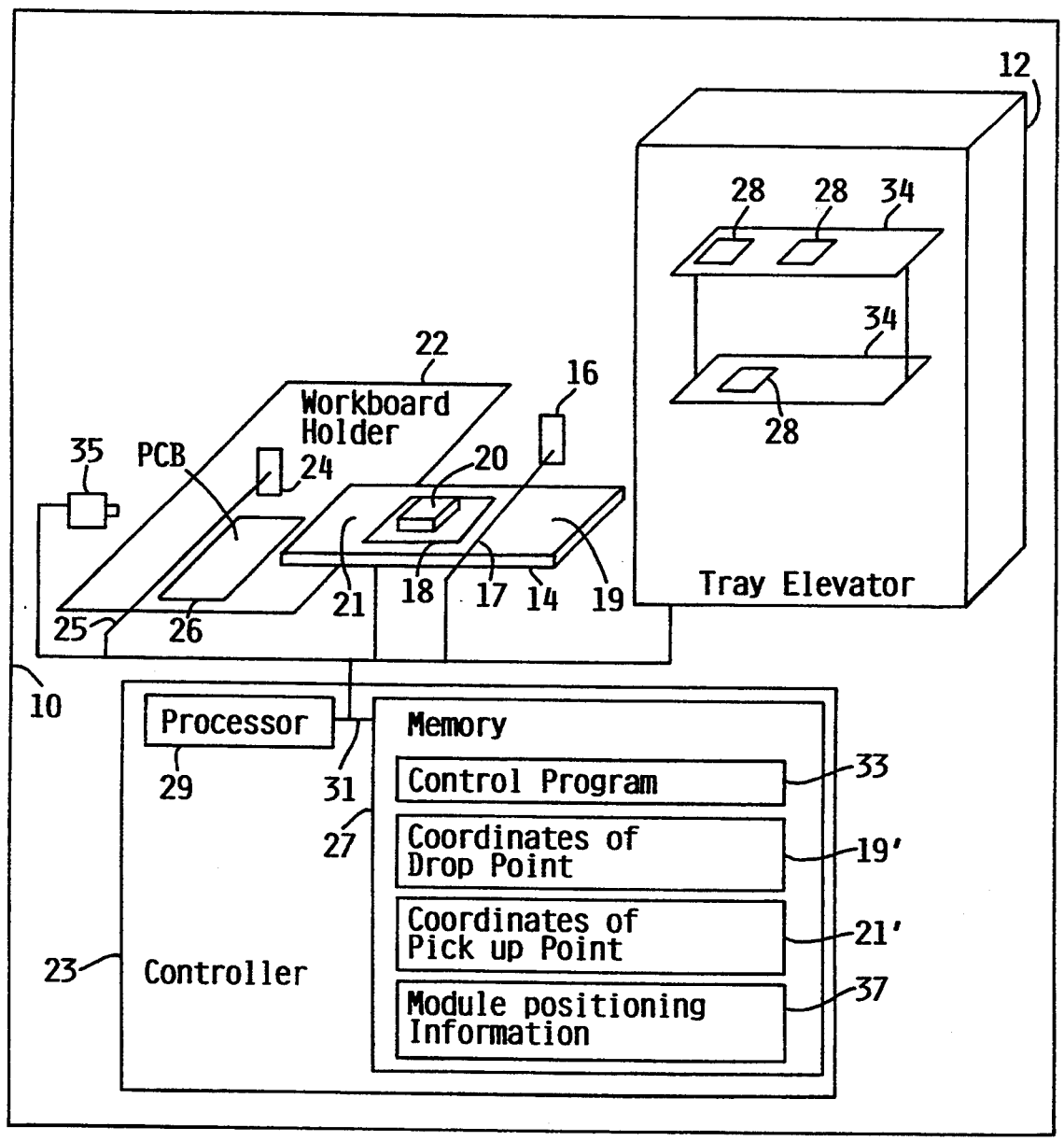
FIG. IA

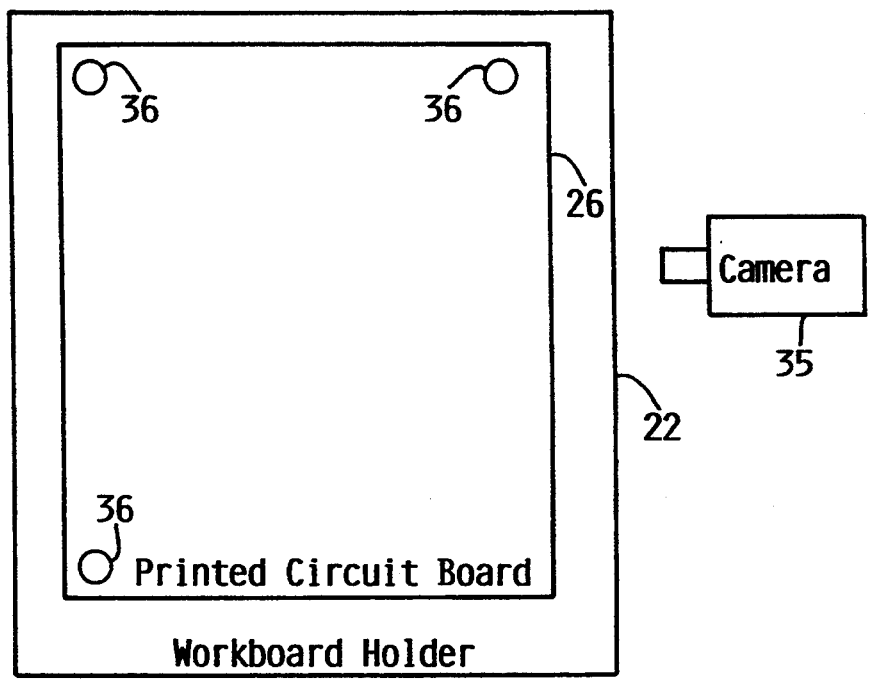
FIG. IB

ALIGNMENT APPARATUS AND METHOD FOR PLACING MODULES ON A CIRCUIT BOARD

FIELD OF THE INVENTION

This invention relates to an automated alignment method and apparatus for assembling modules onto circuit boards. More specifically, this invention relates to properly aligning matrix leaded modules on a printed circuit board using a self aligning nest in a pick and placement tool.

BACKGROUND OF THE INVENTION

Electronic devices such as computers are made from electrical circuits. These electrical circuits are packaged together into modules. A module will typically perform a function or set of related functions. These modules are mounted on printed circuit boards (PCB) and are interconnected by paths of electrical conducting material, which are contained in or on the printed circuit board. A module has leads that extend from the module body into the paths of electrical conducting material. In this way the circuits of one module are connected to the module leads, which are connected to the paths, which are connected to the circuits of other modules. Multiple printed circuit boards are connected together to form the electronic device.

During manufacture of an electronic device, selected modules must be placed on the printed circuit board so that the leads are in the correct location on the correct path. Because the paths and leads are so small, it is important during assembly of the modules on the printed circuit board to properly align the module leads in the paths. In automated manufacturing operations, the placement of the modules on the printed circuit board is done by a machine, called a pick and placement tool. The pick and placement tool picks up a module from a tray of modules, determines the orientation of the module leads with respect to the printed circuit board, and places the module at the correct location on the printed circuit board with the leads of the module in the correct alignment with respect to the paths of electrical conducting material.

The problem lies in determining the position of the leads on the module since the modules in the tray may not be in a known alignment. Pick and placement tools, such as the Panasonic Panasert MPA-80, have used a shadow vision system to solve this problem. Prior to the module being placed on the printed circuit board, the pick and placement tool passes the module past a camera, which shines a light on the module, takes a picture of the shadows that module casts, and determines the orientation of the leads by visual examination of the shadows. This visual inspection process works for peripheral leaded modules, which have leads that extend from the circumference of the module. This visual inspection process, however, does not work for matrix leaded modules because the leads extend from the bottom of the module in a grid pattern, so the leads have no shadow for the camera to see. Matrix leaded modules include such module technologies as ball grid array, column grid array, and land grid array modules. Although more sophisticated cameras exist that can see the matrix leads, these cameras are very expensive.

For the foregoing reasons, there is a need for a manufacturing apparatus and method that can be used with a pick and placement tool to align matrix leaded modules with respect to a printed circuit board without the use of an expensive camera to sense the position of the module leads.

SUMMARY OF THE INVENTION

It is an object of the present invention to provide an enhanced method and apparatus for aligning modules for assembly on printed circuit boards.

It is another object of the present invention to provide a method and apparatus for aligning modules for assembly on printed circuit boards without requiring any moving parts.

It is another object of the present invention to provide a method and apparatus for aligning modules for assembly on printed circuit boards without using a camera to sense the position of the module leads.

It is another object of the present invention to provide a method and apparatus for aligning matrix leaded modules (such as ball grid array, column grid array, and land grid array modules) for assembly on printed circuit boards without using a shadow vision camera.

It is yet another object of this invention to provide a method and apparatus for precisely aligning modules for assembly on printed circuit boards even though the module leads may be misaligned with respect to the module body.

These and other objects are achieved by a pick and placement tool that picks matrix leaded modules, drops or places the modules into a self-aligning nest, picks the modules from the nest and places them on a printed circuit board. The specific location and orientation of the nest with respect to a printed circuit board is known by the pick and placement tool. Once the nest has aligned the module, the tool picks the module from the nest and places it in the appropriate location on the printed circuit board. The nest has sloped sides that angle toward that bottom and are slippery. These sides funnel the module toward the bottom of the nest and correct gross misalignment of the module. At the bottom inside of the nest are locating features into which the leads of the module fit. Between the locating features are slip surfaces so that the module leads slide into the locating features, correcting fine misalignment. Embodiments of the nest work for matrix leaded modules, including ball grid array, column grid array, and land grid array modules.

BRIEF DESCRIPTION OF THE DRAWINGS

FIG. 1A shows an isometric view of the preferred embodiment of the pick and placement tool.

FIG. 1B shows a top view of an example of printed circuit board onto which the pick and placement tool of the preferred embodiment places modules.

DETAILED DESCRIPTION OF PREFERRED EMBODIMENT

Figure 2A:
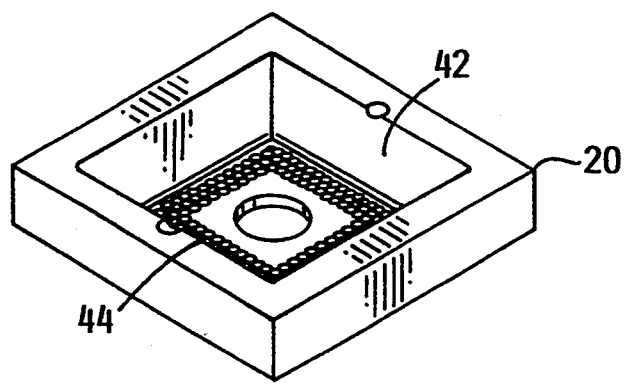
FIGS. 2A, 2B, and 2C show an isometric top view, an isometric bottom view, and a top view, respectively, of the preferred embodiment of the self-aligning nest.
Figure 2B:
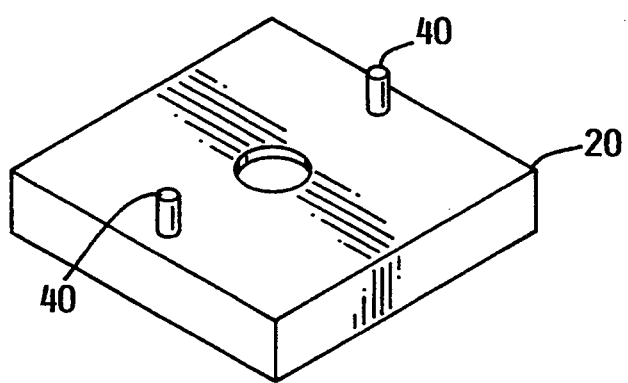
Figure 2C:
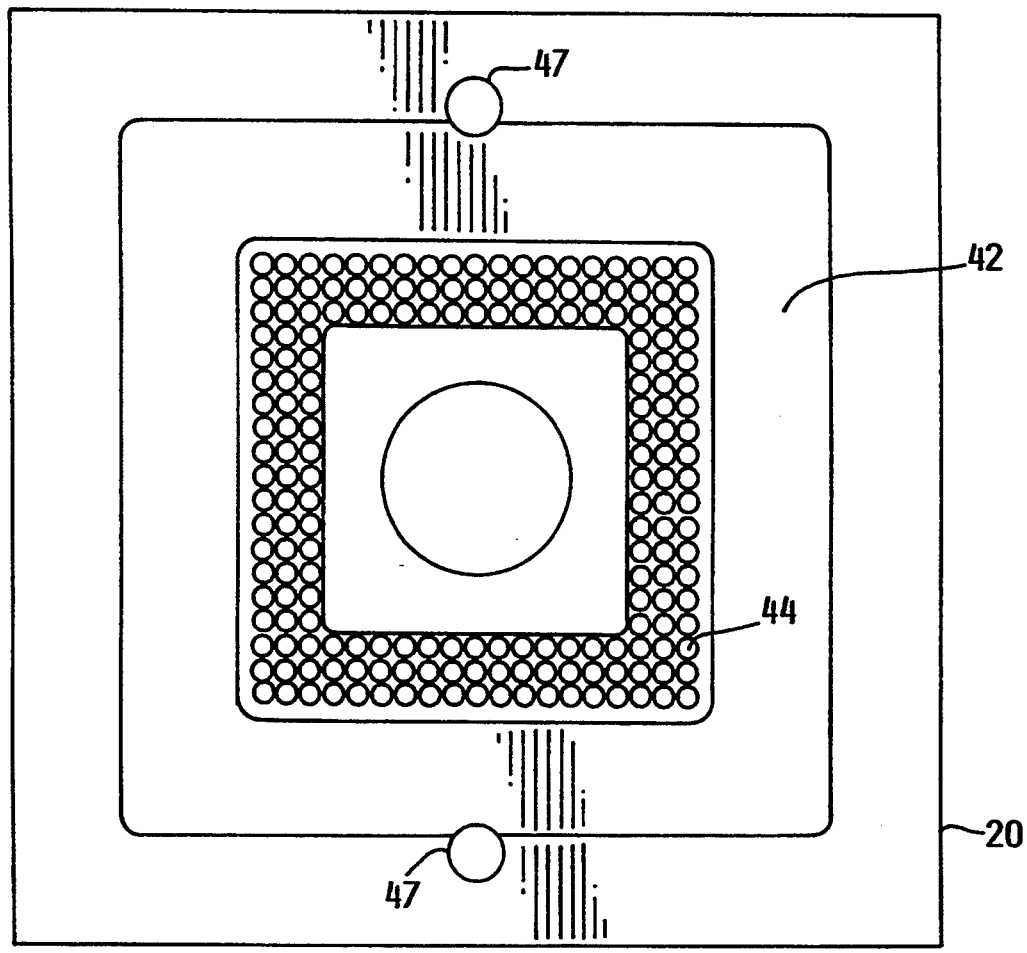
Figure 2D:
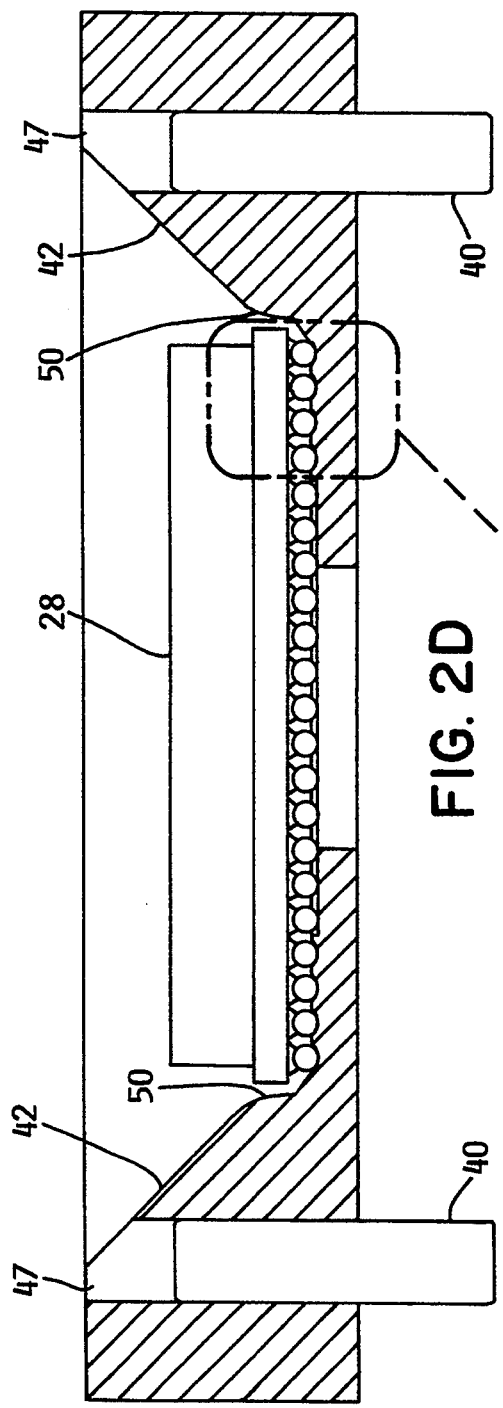
FIG. 2D shows a side cross section view of an example of a ball grid array module placed inside the nest of the preferred embodiment.
Figures 1, 2D:
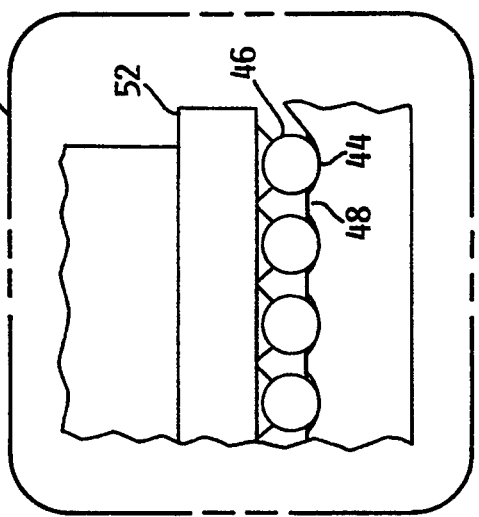

FIG. 1A shows an isometric view of pick and placement tool 10 of the preferred embodiment of the invention. Pick and placement tool 10 contains tray elevator 12, transfer head 16, transfer arm 17, transport 14, shuttle 18, self-aligning nest 20, workboard holder 22, controller 23, placement head 24, placement arm 25, camera 35, controller 23, and bus 31. In the preferred embodiment, tray elevator 12, trays 34, transport 14, camera 35, transfer head 16, transfer arm 17, placement head 24, placement arm 25, and workboard holder 22 are as in a Panasonic Panasert MPA-80. However, the invention will work with many other conventional tools as well, such as the Panasonic Panasert MPA-10, the Universal GSM-1 Model 4685 and the Phillips CSM-84.

Controller 23 controls the operation of pick and placement tool 10. Controller 23 contains processor 29 connected via bus 31 to memory 27, transfer head 16, transfer arm 17, placement head 24, placement arm 25, transport 14, tray elevator 12, and camera 35. Contained within memory 27 is control program 33, which contains instructions that execute on processor 29 to control the operation of pick and placement tool 10. Also contained in memory 27 are coordinates of drop point 19', which identifies drop point 19 on transport 14. Also contained in memory 27 are coordinates of pickup point 21', which identifies pickup point 21 on transport 14. Also in memory 27 is module positioning information 37, which identifies which of the modules will be placed on printed circuit board 26, the location of the modules in tray elevator 12 and trays 34, the coordinates on printed circuit board 26 where the modules will be placed, and the rotation of the modules on printed circuit board 26.

Tray elevator 12 contains a plurality of trays 34. In the preferred embodiment, trays 34 are JEDEC (Joint Electronic Devices Engineering Council) trays. Control program 33 directs tray elevator 12 to moves trays 34 up and down so that the appropriate tray is positioned next to transfer head 16. Tray elevator 12 then slides the appropriate tray out so that it is positioned adjacent to transfer head 16. Transfer head 16 picks module 28 from tray 34. In the preferred embodiment, transfer head 16 is a vacuum nozzle, although any mechanism for picking a module could be used. Although the preferred embodiment uses a tray elevator, any method of delivering appropriate modules to a transfer head could be used. For example, the modules could be in tubes or on reels.

Control program 33 moves transport 14 so that shuttle 18 is at drop point 19, identified by coordinates of drop point 19'. In the preferred embodiment, transport 14 is on a linear bearing, although transport 14 could be any means for transporting the shuttle. Shuttle 18 is affixed to transport 14, and self-aligning nest 20 is affixed to shuttle 18, as will be further described under the description for FIG. 3. Control program 33 moves transfer arm 17 so that transfer head 16, which now is holding module 28, is over self-aligning nest 20 at drop point 19. Transfer head 16 drops or places module 28 into self-aligning nest 20, which puts module 28 into the proper alignment with respect to printed circuit board 26 as will be further described for FIGS. 2 and 3.

Control program 33 moves transport 14, so that shuttle 18 is carried to pickup point 21. Control program 33 moves placement arm 25 so that placement head 24 is positioned over pickup point 21, and then placement head 25 picks module 28 from nest 20. Control program 33 uses coordinates of pickup point 21' to find pickup point 21. In the preferred embodiment, placement head 24 is a vacuum nozzle, but it could use any means to pick up the module.

Control program 33 finds the precise location of printed circuit board 26, which is mounted on workboard holder 22, using camera 35. Workboards carrying printed circuit boards move through pick and placement tool 10 on a conveyor system, not shown. Referring to FIG. 1B, in the preferred embodiment, printed circuit board 26 contains fiducials 36, which are dots of copper visible to camera 35. Camera 35 senses the location and position of fiducials 36, and transmits this information to control program 33, which uses this information to accurately place modules 28 on printed circuit board 26. In the preferred embodiment, printed circuit board 26 contains three fiducials 36.

Referring to FIG. 1A, control program 33 uses module positioning information 37 and the information obtained from fiducials 36 to direct placement head 24 to place module 28 in the proper position and rotation on printed circuit board 26. Although in the preferred embodiment, transfer head 16 and placement head 24 are separate, and likewise transfer arm 17 and placement arm 25 are separate, there could be just a single head attached to a single arm that has a range of motion sufficient to accomplish the tasks of both transfer head 16 and placement head 24.

FIG. 2A shows an isometric view of the preferred embodiment of self-aligning nest 20. Nest 20 has four sloping sides 42 that are angled so that the opening of nest 20 is larger at the top than at the bottom. In the preferred embodiment, the sides are approximately at a 45 degree angle. Sides 42 are machined so that they are slippery. In the preferred embodiment, sides 42 have a surface roughness finish of between N9 and N12 (250–2000 micro-inches). The sloping sides 42 and their smooth surfaces act to correct gross misalignments of module 28 and to funnel module 28 to the bottom of nest 20 when module 28 is dropped or placed by transfer head 16. Nest 20 has locating features 44 on the inside bottom, which act to correct fine misalignment of module 28 and are more fully described under the description for FIG. 2C.

FIG. 2B shows an isometric bottom view of the preferred embodiment of self-aligning nest 20. On the bottom of nest 20 are alignment pins 40, which align nest 20 to shuttle 18, as more fully described under the description for FIG. 3.

FIG. 2C shows a top view of the preferred embodiment of self-aligning nest 20. In the preferred embodiment, locating features 44 are depressions into which leads of module 28 fit, as more fully described in the description for FIG. 2D. Precision-drilled press-fit holes 47 receive pins 40.

FIG. 2D shows a cross section side view of the preferred embodiment of module 28 aligned in nest 20. Locating features 44 in this example are curved depressions to accommodate leads 46 from ball grid array module 28. In the preferred embodiment, the radius of locating feature 44 is slightly larger than the radius of lead 46. In between locating features 44 are slip surfaces 48, which help to cause module leads 46 to slide into locating features 44, accomplishing fine alignment of module 28. Because self-aligning nest 20 aligns module leads 46 with respect to the position of nest 20, any misalignment between module leads 46 and module 28 is irrelevant. In the preferred embodiment, ball grid array technology is used. Although ball grid array leads are show in FIG. 2D, the invention also applies to other matrix leaded modules such as column grid array, and land grid array modules. In the preferred embodiment, the ratio of the length of slip surface 48 to the diameter of locating feature 44 on center line between features is approximately 1:4. Pins 40 are press fit into precision-drilled press-fit holes 47 in self-aligning nest 20. Side engagements 50 are the portion of the sides of nest 20 that are next to module body 52. Side engagements 50 are approximately vertical in order to facilitate funneling module leads 46 into proper locating features 44.

Figure 3:
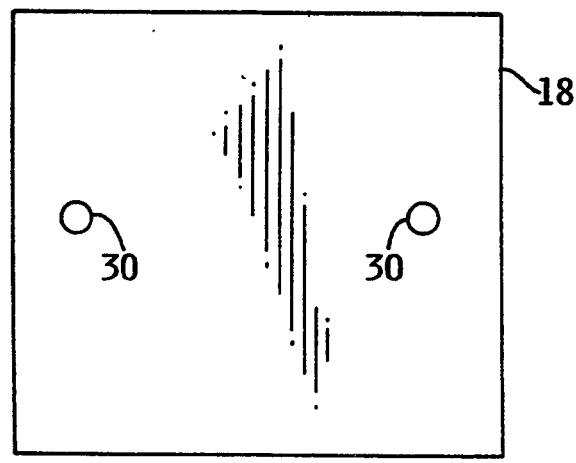
FIG. 3 shows a top view of the shuttle of the preferred embodiment.

FIG. 3 shows a top view of shuttle 18 of the preferred embodiment. Shuttle 18 contains alignment holes 30 into which alignment pins 40 slip fit in order to align nest 20 with respect to shuttle 18. In the preferred embodiment, holes 30 are precision drilled for a slip fit in shuttle 18 using a jigbore.

Figure 4:
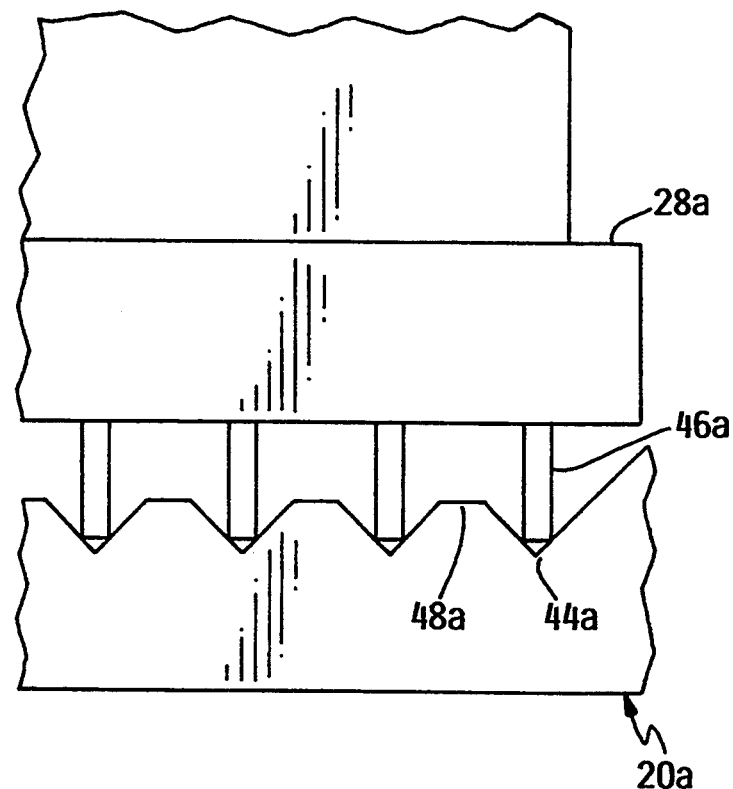
FIG. 4 shows a side cross section view of an example of a column grid array module inside the nest of an alternative embodiment.

FIG. 4 shows a cross section side view of an alternative embodiment of self aligning nest 20a. In this example, module 28a is a column grid array module having column leads 46a, which slide over slip surfaces 48a into locating features 44a. Locating features 44a are conical or funnel shaped.

While this invention has been described with respect to the preferred and alternative embodiments, it will be understood by those skilled in the art that various changes in detail may be made therein without departing from the spirit, scope, and teaching of the invention. For example, the shuttle and the transport are not necessary to practice the invention. Instead, the nest could be stationary, and a single placement arm and head could have sufficient range of motion to pick the module, place it in the nest, retrieve the module from the nest and place the module on the printed circuit board. Accordingly, the herein disclosed invention is to be limited only as specified in the following claims:

What is claimed is:

1. A method for aligning a matrix leaded module on a circuit board, comprising the steps of:
   picking the module for assembly;
   placing the module into a self-aligning nest, wherein the nest has
      angled sides, the sides having slip surfaces, and
      locating features on the inside bottom of the nest for aligning the module leads;
   removing the module from the nest with a placement head, the placement head having a known position with respect to the nest; and
   placing the module on the circuit board.

2. The method of claim 1 wherein the locating features are depressions for receiving leads of a ball grid array module.

3. The method of claim 1 wherein the locating features are depressions for receiving leads from a column grid array module.

4. The method of claim 1 wherein the placement head removes the module from the nest using a vacuum nozzle.

5. A nest apparatus for self-aligning a matrix leaded module, comprising:
   alignment means for aligning the nest to a known position;
   angled sides with slip surfaces; and
   locating features on inside bottom of the nest for aligning the module leads.

6. The apparatus of claim 5 wherein the locating features further comprise depressions for accepting the leads of a ball grid array module.

7. The apparatus of claim 5 wherein the locating features are depressions for receiving leads from a column grid array module.

8. The apparatus of claim 5 wherein the alignment means comprises alignment pins connected to a shuttle.

9. An apparatus for assembling matrix leaded modules on a circuit board, comprising;
   a tray elevator;
   a plurality of trays, holding a plurality of modules, mounted in the tray elevator;
   a shuttle, disposed adjacent to the tray elevator;
   a transfer head, for transporting a module from the tray to the shuttle;
   a self-aligning nest mounted on the shuttle, the nest having
      angled sides, the sides having slip surfaces, and
      locating features on the inside bottom of the nest for aligning the module leads; and
   a placement head, having a known orientation with respect to the nest, which picks the module from the nest and places the module on a circuit board.

10. The apparatus of claim 9 wherein the nest is mounted on the shuttle with alignment pins.

* * * * *